(12) United States Patent
Krishnan et al.

(10) Patent No.: US 10,627,999 B2
(45) Date of Patent: *Apr. 21, 2020

(54) METHOD AND SYSTEM OF INTERACTING WITH BUILDING SECURITY SYSTEMS

(71) Applicant: Honeywell International Inc., Morris Plains, NJ (US)

(72) Inventors: Viswanathan Chatapuram Krishnan, Mandurai (IN); Sakkaravarthy Muniyasamy, Mandurai (IN); Vinoth Dharmalingam, Erode (IN)

(73) Assignee: Honeywell International Inc., Morris Plains, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/355,444

(22) Filed: Mar. 15, 2019

(65) Prior Publication Data

US 2019/0212883 A1 Jul. 11, 2019

Related U.S. Application Data

(63) Continuation of application No. 15/003,159, filed on Jan. 21, 2016, now Pat. No. 10,241,647, which is a
(Continued)

(51) Int. Cl.
*G06F 3/0482* (2013.01)
*G06F 3/0481* (2013.01)
(Continued)

(52) U.S. Cl.
CPC ........ *G06F 3/0482* (2013.01); *G06F 3/04815* (2013.01); *G06F 3/04842* (2013.01);
(Continued)

(58) Field of Classification Search
CPC .............. G06F 3/0482; G06F 3/04815; G06F 3/04842; G06F 3/04847; G06F 17/5004; G06Q 10/06; G06T 19/00
(Continued)

(56) References Cited

U.S. PATENT DOCUMENTS 5,086,385 A * 2/1992 Launey ............... G06F 3/04847
340/6.11
8,732,125 B2 * 5/2014 Omansky ............ G06F 17/5004
707/621

(Continued)

OTHER PUBLICATIONS

Examination report from corresponding Canadian patent application 2,880,694, dated May 25, 2016.
(Continued)

*Primary Examiner* — John A Tweel, Jr.
(74) *Attorney, Agent, or Firm* — Seager Tufte & Wickhem LLP

(57) ABSTRACT

A system including a security system having a plurality of sensors and actuators within a building and a respective control feature embodied as a programmed processor and associated with operation of the security system and at least some of the plurality of sensors and actuators, a user display of a portable wireless device that depicts a portion of the building using a building information model (BIM), an user interface of the wireless device that receives a symbol drawn by a human user over part of the building portion and a processor that correlates the symbol with a control feature of the security system based upon proximity of the symbol on the display with a location of an associated sensor or actuator of the control feature within the BIM model of the building.

20 Claims, 4 Drawing Sheets

Related U.S. Application Data continuation of application No. 14/173,960, filed on Feb. 6, 2014, now Pat. No. 9,268,473.

(51) Int. Cl.
  *G06T 19/00* (2011.01)
  *G06F 17/50* (2006.01)
  *G08B 25/14* (2006.01)
  *G06F 3/0484* (2013.01)
  *G08B 29/02* (2006.01)

(52) U.S. Cl.
  CPC ...... *G06F 3/04847* (2013.01); *G06F 17/5004* (2013.01); *G06T 19/00* (2013.01); *G08B 25/14* (2013.01); *G08B 29/02* (2013.01)

(58) Field of Classification Search
  USPC .......................................................... 715/734
  See application file for complete search history.

(56) References Cited

U.S. PATENT DOCUMENTS

| | | | |
|---|---|---|---|
| 9,268,473 B2 * | 2/2016 | Krishnan | G06F 3/0482 |
| 9,342,223 B2 * | 5/2016 | Dharmalingam | G06F 3/04842 |
| 10,241,647 B2 * | 3/2019 | Krishnan | G06F 3/0482 |
| 2012/0191223 A1 | 7/2012 | Dharwada et al. | |
| 2012/0284596 A1 * | 11/2012 | Bushnell | G06Q 10/06 715/205 |
| 2012/0296610 A1 | 11/2012 | Hallemariam et al. | |
| 2013/0054033 A1 * | 2/2013 | Casilli | H04L 12/282 700/276 |
| 2014/0327670 A1 * | 11/2014 | Chen | G06T 19/003 345/420 |
| 2015/0052469 A1 | 2/2015 | Dharmallingam et al. | |
| 2015/0089344 A1 * | 3/2015 | Pickering | G06F 17/5004 715/215 |
| 2015/0120297 A1 * | 4/2015 | Meruva | G10L 15/063 704/243 |

OTHER PUBLICATIONS

Extended European Search Report corresponding to EP Application No. 15152390.9, dated Jun. 9, 2015.

* cited by examiner

METHOD AND SYSTEM OF INTERACTING WITH BUILDING SECURITY SYSTEMS

CROSS-REFERENCE TO RELATED APPLICATIONS

This application is a continuation of U.S. application Ser. No. 15/003,159 filed Jan. 21, 2016, which is a continuation of U.S. application Ser. No. 14/173,960 filed Feb. 6, 2014, now U.S. Pat. No. 9,268,473 issued Feb. 23, 2016, both of which are herein incorporated by reference.

FIELD

The application pertains to security systems and more particularly to interfaces for security systems.

BACKGROUND

Systems are known to secure geographic areas such as homes or businesses from threats. Such systems are typically based upon the use of one or more sensors placed on or around the secured area.

Some security systems are directed primarily to threats from intruders. Other systems may be directed threats from intruders and/or environmental threats such as from fire, smoke or toxic gases.

In the case of a home or business, a security system may include a number of sensors placed along the periphery of the secured area on the doors and/or windows allowing entry into the secured area. In some cases, the sensors may be limit switches that operate to detect the opening of any door or window.

Other intrusion detectors may be placed in the interior of the secured area. In this case, passive infrared (PIR) detectors or television cameras with motion detection capability may be used to detect intruders who have been able to circumvent sensors on the periphery of the secured area.

In many cases, the sensors of the security system are monitored by a local control panel. In the event of activation of a sensor, the control panel may activate a local audible alarm that warns authorized occupants.

A local user interface to the control panel may also be provided. The user interface may be provided to allow authorized users to arm the security system during periods when the secured area is unoccupied and to disarm the system after return by the authorized person.

While existing security systems work well, it is often difficult to adapt the system to changing circumstances. For example, sensors may malfunction and may need to be disabled. Alternatively, the names of authorized users may need to be added or deleted from a list of authorized users. Accordingly, a need exists for improved methods of interfacing with security systems.

DETAILED DESCRIPTION

Figure 1:
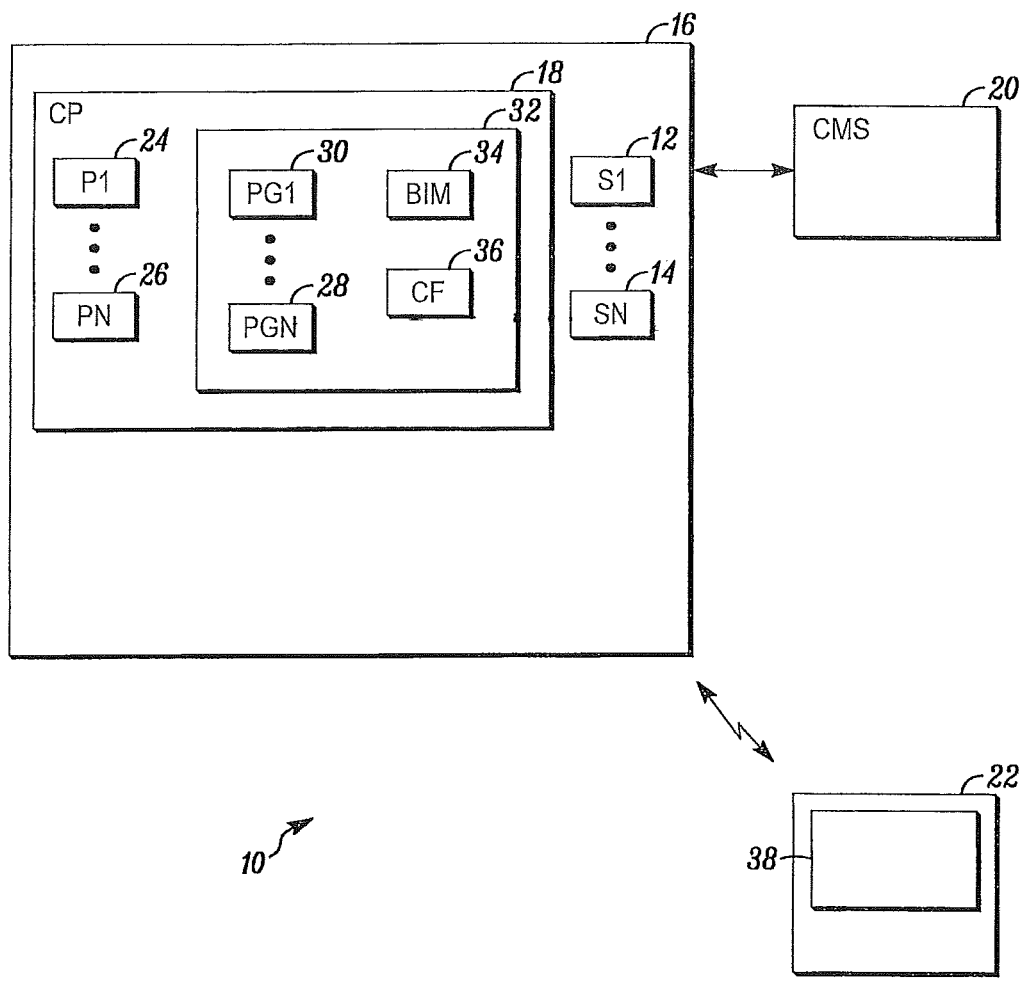
FIG. 1 illustrates a block diagram of a security system in accordance herewith.

While disclosed embodiments can take many different forms, specific embodiments thereof are shown in the drawings and will be described herein in detail with the understanding that the present disclosure is to be considered as an exemplification of the principles thereof as well as the best mode of practicing same, and is not intended to limit the application or claims to the specific embodiment illustrated.

The claimed invention is directed to a novel interface for a security system that is simple and intuitive to use. The interface operates on wireless portable devices in a manner that is familiar to most users of such devices.

In general, any security control system should abstract the knowledge of all low level devices into a simple form that allows the end user to interact with the system quickly and easily. Current systems force the end user to have complete knowledge of the devices in order to perform any actions on the system. This unnecessarily forces the end user to have extensive training and increases the cost of such systems.

For example, if an operator or end user should want to shunt an input in an area or buffer a panel in an area, then the user has to know the identifier of the panel configured in the area. With the identifier, the user may select the panel and right click on the panel to retrieve information about the panel. Thereafter, the operator selects a menu option corresponding to the operation that he/she wants to perform. This has a number of drawbacks. First, the operator needs to know the exact steps needed to accomplish the operation. Second, the operator needs to be familiar with the functionality of each menu option and, third, the operator needs to know which devices are set up in any particular area in order to perform the desired operation. These factors combine to require extensive training in order for an operator to efficiently deal with even minor issues.

For example, imagine the difficulty of the task of configuring a building having multiple floors and doors in order to allow access to a new employee of an organization. In this situation, the operator must identify the doors in the building and then the changes in order to allow/deny access by the employee through each of the doors.

With the advent of smart phones and tablets, the way that users interact with applications on smart phones and tablets has undergone dramatic changes. There is no longer any need for logging into web applications and making required changes, etc. each time a new application is added or the conditions of use have changed. Applications (apps) are available for automatic setup and this simplifies the configuration and monitoring process. One of the main advantages of using native phone apps is the ability to leverage the native features (supported by iOS or Android enabled devices) such as touch screens, cameras, etc.

The disclosed solution builds on these features by using on-screen drawings in conjunction with the capabilities of iOS or Android enabled Touch Based Devices. In other words, the user is allowed to create symbols on a display of a BIM based security system and the system is able to learn and apply the symbols accordingly.

The disclosed solution relies upon the use of on-screen drawings (symbols) which naturally imply a particular operation in a security system. In other words, the operator draws a symbol on his smart phone/tablet over a BIM image and the software recognizes the most natural meaning for that symbol in the context of the security system.

FIG. 1 is a simplified block diagram of a security system 10 shown generally in accordance with an illustrated embodiment. Included within the system is a number of sensors 12, 14 that detect threats to safety and security within a secured area 16.

The sensors used within the secured area may be chosen based upon any of a number of different criterion. For example, at least some of the sensors may be limit switches placed on the doors and windows of any building that defines all or part of the secured area. Alternatively, PIR sensors or television camera based motion sensors may be used to detect intruders within an interior portion of the secured area.

Alternatively, at least some of the sensors may be environmental sensors used to detect threats to the safety of human occupants. In this case, the sensors may include fire detectors, carbon monoxide or natural gas detectors, etc.

Included within the secured area, or located remotely, may be a control panel 18. In this case, the control panel may monitor a state of each of the sensors. Upon detecting activation of any of the sensors, the control panel may send an alarm message to a central monitoring station 20.

Also associated with the secured area may be one or more portable wireless devices (e.g., iphones, Android devices, etc.) 22. The portable wireless devices may be used to arm/disarm the security system, receive alarms and/or to configure the security system.

Included within the control panel and within each of the portable wireless devices is control circuitry including one or more processor apparatus (processors) 24, 26, each operating under control of one or more computer programs 28, 30 loaded from a non-transient computer readable medium (memory) 32. As used herein, reference to a step performed by a computer program is also reference to the processor that executed that step.

Included within memory is a building information model (BIM) of the secured area embodied as a BIM file 34. Included within the BIM file are the physical characteristics of the secured area including a geographic location of the boundaries of the secured area and the characteristics of any structures within the secured area. For example, the three dimensional characteristics of any buildings within the secured area are embodied as a set of coordinates that describes each wall and floor of the building as well as the floor's contents. Also included within the BIM file are the geographic coordinates of each of the sensors and actuators of the security system. For example, at least some doors of a building within the secured area may have a sensor in the form of a card reader and an actuator in the form of an electrically activated lock. Alternatively, actuators in the form of audible and/or visual alarms may be located within the secured area or its buildings. In all cases, the coordinates of each of the devices may be saved in the BIM file as GPS coordinates or as coordinates within some other reference locating system.

Included within the control panel and/or the portable wireless devices are one or more control features. The control features are used in conjunction with one or more corresponding configuration processor(s) in order to provide an interface between a human user and the security system.

In this regard, a control feature is a processor executing a set of program steps that display information about the security system and accept instructions for control and setup of the security system through an interface provided on a touch sensitive screen of a wireless portable device. In this regard, an interface processor within each of the portable devices connects the control and configuration processor of the panel with a display 38 or a display and keyboard of the portable device.

In this regard the interface processor may be a native application located on the portable device that runs in the background. Upon activation of the portable device, the interface processor remains in the background and initially presents a security system icon on the display. Upon activation of the icon, the interface processor may form a secure connection with the control and configuration processor within the control panel and display additional icons on the display of the portable device including arm and disarm icons and a "configure the security system" (configuration) icon. The user may arm and disarm the security system by selecting the appropriate icons on the display.

Alternatively, the user may select the configuration icon in order to amend or otherwise change some of the operating parameters of the security system. Upon activating the configuration icon, a BIM processor within the portable device or alarm panel may present an image of the secured area. Using the image, the user may pan right, left or up and down to view images of the secured area and to zoom in and out in order to obtain full screen images of certain portions of the secured area.

In addition to displaying various images of the secured area, the user may also display and access certain configuration utilities by drawing figures (symbols) over portions of the display. In response, a correlation processor may correlate the location of a drawn symbol with the most likely configuration utility to be accessed.

Figure 2:
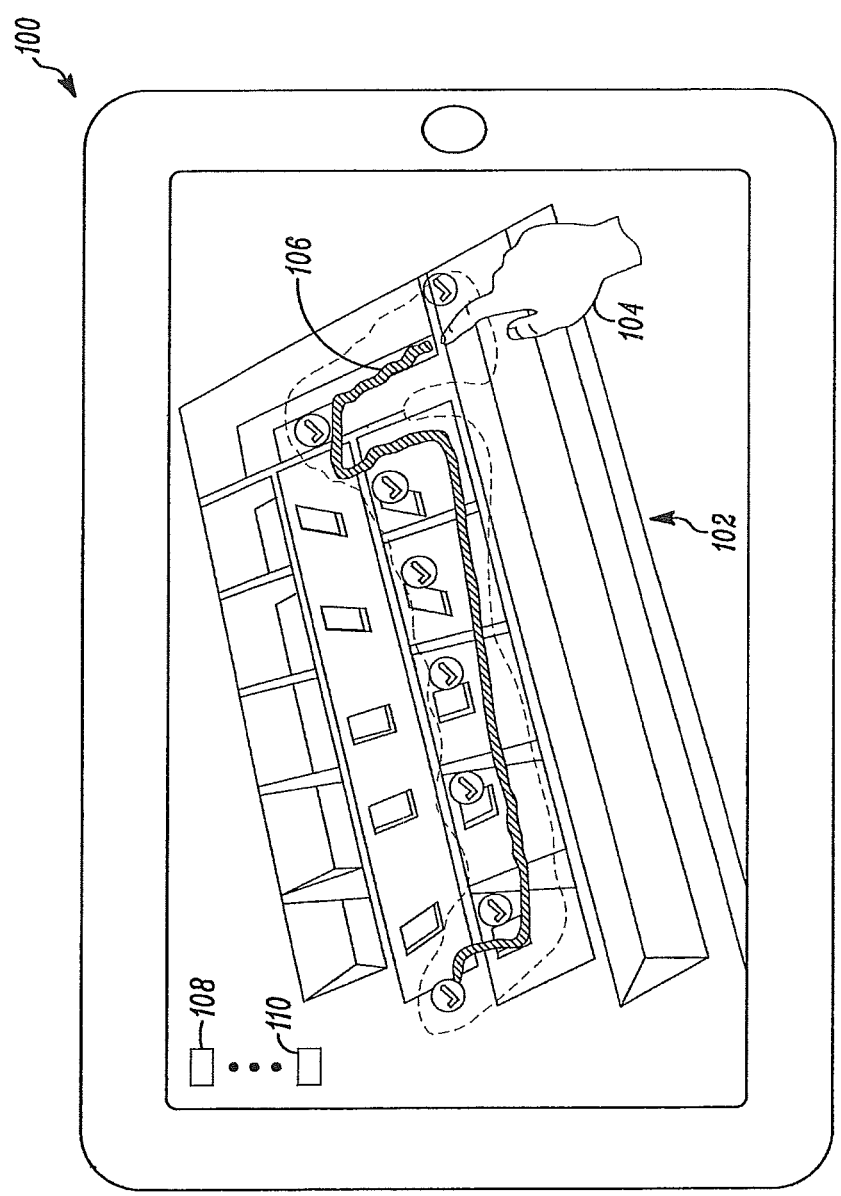
FIG. 2 is an overhead view of a portion of a secured area protected by the security system that is displayed on a screen of a portable wireless device used within the system of FIG. 1.
Figure 3:
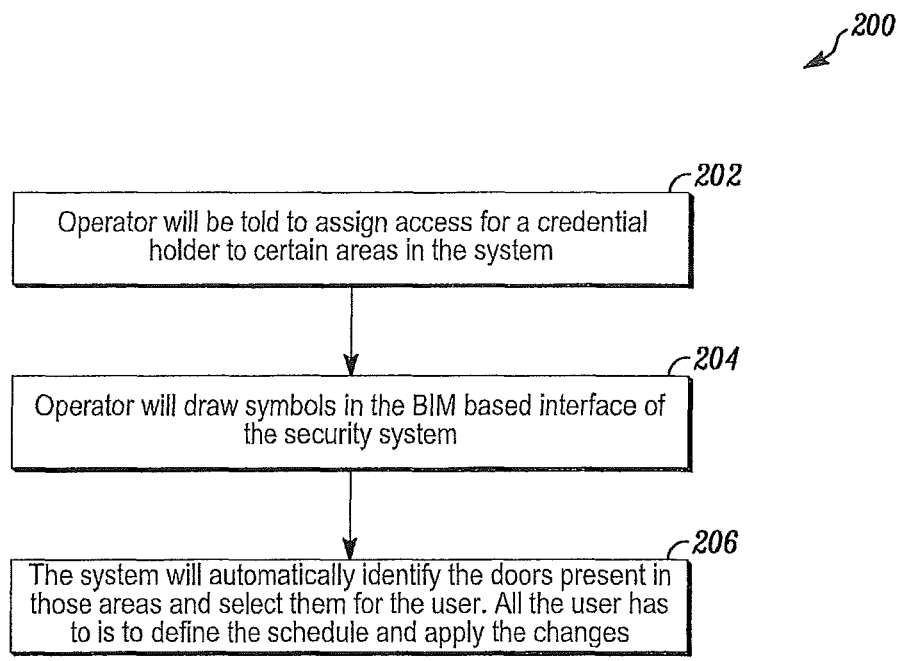
FIG. 3 is a flow chart of a set of steps that may be used by the system of FIG. 1 in conjunction with the image of FIG. 2.

For example, FIG. 2 depicts an overhead view of a floor of a building depicted on the display of a portable device. FIG. 3 depicts a process 200 including a set of steps that may be performed in conjunction with FIG. 2. In this case, an operator may have been assigned the task 202 of providing or otherwise providing access by an authorized credential holder into certain areas of the secure area of the system. To achieve this objective, the human operator (user) may access the appropriate portion of the secured area using finger contact with the screen and/or a set of navigation or feature selection buttons 108, 110. For example, the user may have selected the floor by first double clicking (tapping his/her finger) on an overhead view of the secured area and then on a floor of a building within the secured area. In each case, the correlation processor reacted to the double clicks by zooming in on a particular building feature closest to the site of the double click to arrive at the overhead view shown in FIG. 2.

In FIG. 2, the user selects a set of security features on the floor by placing his/her finger in contact with the touch sensitive display of the portable device and moving his finger across the image (i.e., across the security devices that he/she wants to select). The correlation processor or a separate tracking processor within the portable device detects contact by the user's finger with the screen and the movement of the user's finger across the screen as the user creates portions 106 of the symbol 204. Once the user lifts his/her finger from the screen, the tracking processor detects completion of the symbol and the need to correlate the completed symbol with one or more security features of the displayed portion (i.e., the selected floor of a building) of the secured area.

In the particular example of FIG. 2, the symbol overlaps areas protected by a number of doors. In response, the system automatically identifies 206 the doors present in those areas and selects them for the user. All the user has to do is to define the schedule and apply the changes.

Upon completion of the drawing of the symbol by the user on the BIM image, the correlation processor correlates the symbol to security features by first determining that the symbol crosses a number of closed spaces (i.e., rooms). The correlation processor then determines that each of the rooms has an access control device associated with the rooms. The access control devices may include a lock on an entrance door to the room and an access device (e.g., a card reader) adjacent to and outside of the door.

The correlation processor may also determine that the access control devices are the highest level security devices associated with the symbol. For example, if the symbol had crossed or otherwise passed over a control panel of the security system, then the correlation processor would determine that the control panel was the intended target of the selection and proceed accordingly.

In the case of FIG. 2, the correlation processor determines that the security features selected by the symbol are the access control devices associated with the five interior rooms and access control devices providing entry into the hallway providing access to the five interior rooms. In order to allow the user to confirm the selection, the correlation processor superimposes a check mark (shown in FIG. 2) over or adjacent the respective access control device selected.

The user may confirm the selections by activating an ENTER button. Alternatively, the user may touch certain of the displayed checkmarks to un-select one or more access control devices and then activate the ENTER button.

In response, the configuration processor may activate a configuration processor associated with each of the access control devices. In response, the configuration processor may provide a graphical user interface (GUI) for each of the seven access control devices or a single GUI that controls the configuration of the seven access control devices as a single group. Each of the GUIs is operated by a respective programmed (i.e., a GUI) processor.

By accessing the seven access control devices in this way, the user can change the way that each of the doors operates. For example, the displayed GUI may include a list of persons authorized to enter the respective spaces controlled by the seven access control devices and a time of entry into each of the spaces.

The user may enter common changes such as by changing a time of day that entry is allowed into each of the spaces. Alternatively, the user may add or delete names that are allowed entry into each of the seven spaces. The user may complete the modification by activating an APPLY softkey displayed on the GUI.

The user may then activate a DONE softkey or a BACK softkey. If the user activates the DONE softkey, then the user may be returned to the main screen. If the user activates the BACK softkey, the user is taken back to the screen shown in FIG. 2 where the user is then able to de-select certain access control devices and repeat the process in order to make specific changes to the respective access control device for each of the respective spaces.

Figure 4:
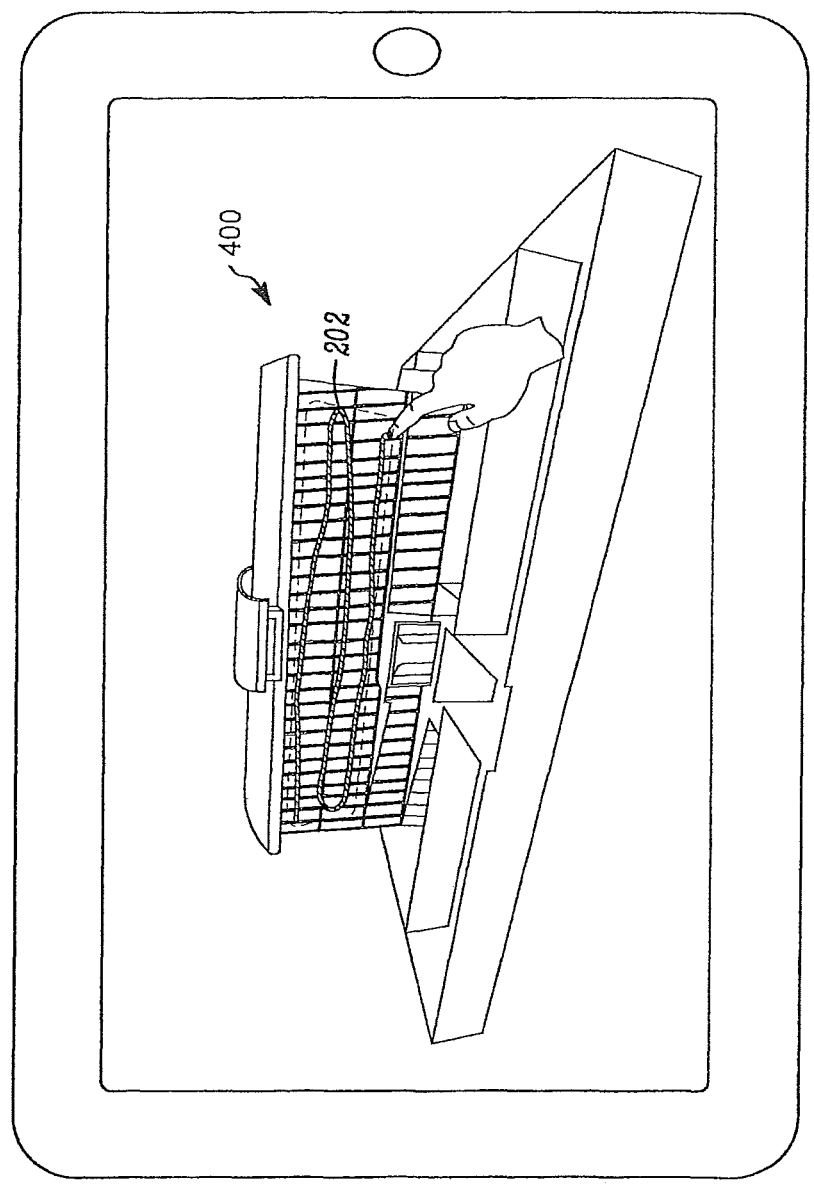
FIG. 4 is a side perspective view of another portion of the secured area protected by the system of FIG. 1.

FIG. 4 depicts another example of the configuration access system. In FIG. 4, the user has used his/her finger and/or a set of navigation buttons to interact with the BIM processor through the GUI in order to navigate through the various views provided by the BIM model and to display a side perspective view 400 of a building within the secured area.

In this case, the user creates an symbol that extends across the side of the building and covers multiple floors of the building. In this case, the correlation processor cannot match the symbol to local access controls, alarms or annunciators because the side perspective view results in the symbol covering any devices extending across the width of the building. In this case, the correlation processor correlates the symbol to an alarm panel that controls security devices within the entire building.

Upon determining that the symbol applies to the whole building, the correlation processor may determine that the symbol is a stop/buffer (stop or buffer) symbol used for buffering panels, shunting inputs, zones, etc. Buffering or shunting inputs simply means that the activation of an alarm sensor does not result in an alarm message being reported to the central monitoring station. Buffering or shunting inputs, in fact, may be used to test the security system by testing each sensor and annunciator within the secured area.

In response to detecting the stop/buffer symbol over the building, the correlation processor may activate a building configuration processor that may display an overview of alarm features within the building. In this case, the configuration processor may display an outline of the alarm panel with a disarm check box. The configuration processor may also display a list of alarm zones within the building with a respective check box for individually disarming each of the zones.

In another embodiment, one of the feature buttons on the portable device may be selected to display hardware devices superimposed over the displayed images of the secured area and displayed on the portable device. This may be useful to display the relative location of sensors, actuators or control panels within the secured area. Once the hardware devices are displayed on the portable device, the user may associate a symbol with one or more of these devices in order to select this device and an associated control feature for this device. For example, the display could show a fire detector in a room. The user could select the fire detector by drawing a circle around the device. In response the correlation processor may associate the symbol (i.e., the circle drawn around the detector) with a control feature of the device. This could allow the user to deactivate or otherwise configure the device using the control feature.

In general, the system includes a security system having a plurality of sensors and actuators within a building and a respective control feature embodied as a programmed processor and associated with operation of the security system and at least some of the plurality of sensors and actuators, a user display of a portable wireless device that depicts a portion of the building using a building information model (BIM), a user interface of the wireless device that receives a symbol drawn by a human user over part of the building portion and a processor that correlates the symbol with a control feature of the security system based upon proximity of the symbol on the display with a location of an associated sensor or actuator of the control feature within the BIM model of the building.

In another embodiment, the system includes a security system having a control panel and a plurality of sensors and actuators within a secured area and a respective control feature embodied as a programmed processor and associated with operation of the security system, the control panel and at least some of its sensors and actuators, a user display of a portable wireless device that depicts a portion of the secured area using a building information model (BIM), a user interface of the wireless device that receives a symbol drawn by a human user over part of the depicted portion of the secured area, and a processor that correlates the symbol with a control feature of the security system based upon proximity of the symbol on the display with a location of a corresponding control panel, sensor or actuator of the control feature within the BIM model of the secured area.

In still another embodiment, the system includes a security system having a control panel and a plurality of sensors and actuators within a secured area and a respective control feature embodied as a programmed processor and associated with operation of the security system, the control panel and at least some of its sensors and actuators, a user display of a portable wireless device that depicts a portion of the secured area using a building information model (BIM) where the BIM includes a geographic location of each of the control panel, the sensors and actuators, a user interface of the wireless device that receives a symbol drawn by a human user over part of the depicted portion of the secured area, a processor that correlates the symbol with at least one control feature within the secured area of the security system based upon proximity of the symbol on the display with a location of one or more of a corresponding control panel, sensor or actuator of the at least one control feature within the BIM model of the secured area and a processor that displays a check box for each correlated control feature adjacent the symbol and each corresponding control panel, sensor or actuator and through which the user selects desired control features.

From the foregoing, it will be observed that numerous variations and modifications may be effected without departing from the spirit and scope hereof. It is to be understood that no limitation with respect to the specific apparatus illustrated herein is intended or should be inferred. It is, of course, intended to cover by the appended claims all such modifications as fall within the scope of the claims. Further, logic flows depicted in the figures do not require the particular order shown, or sequential order, to achieve desirable results. Other steps may be provided, or steps may be eliminated, from the described flows, and other components may be add to, or removed from the described embodiments.

What is claimed is:

1. A method comprising:
   displaying an overhead view of a region of interest of a building on a touch sensitive display, wherein the region of interest is serviced by a plurality of security devices each servicing a corresponding area of the region of interest;
   making a dragging motion on the touch sensitive display along a path, wherein the path overlaps one or more of the areas of the region of interest;
   identifying the security devices of the plurality of security devices that service the one or more areas of the region of interest that the path overlaps;
   selecting one or more of the identified security devices; and
   changing a configuration setting of one or more of the selected one or more of the identified security devices.

2. The method of claim 1, wherein the selecting step selects all of the security devices identified by the identifying step.

3. The method of claim 1, wherein the changing step changes a configuration setting of all of the selected one or more identified security devices to a common configuration setting as a group.

4. The method of claim 1, wherein the changing step changes a configuration setting of the selected one or more identified security devices on an individual basis.

5. The method of claim 1, wherein the overhead view of the region of interest shows the location of each of the plurality of security devices.

6. The method of claim 5, wherein the path does not need to overlap the location of a security device for that security device to be identified and selected.

7. The method of claim 1, wherein the configuration setting comprises access rights for a particular individual.

8. The method of claim 1, further comprising:
   displaying an indication on the overhead view of the region of interest that indicates which of the one or more of the identified security devices are selected.

9. The method of claim 8, further comprising:
   allowing a user to de-select one or more of the selected security devices before changing the configuration setting of one or more of the selected one or more of the identified security devices.

10. The method of claim 1, further comprising:
    allowing a user to de-select one or more of the selected security devices before changing the configuration setting of one or more of the selected one or more of the identified security devices.

11. A non-transient computer readable medium that stores instructions that when executed cause a mobile device with a touch sensitive display to:
    display an overhead view of a region of interest of a building on the touch sensitive display, wherein the region of interest is serviced by a plurality of security devices each servicing a corresponding area of the region of interest;
    receive a drag motion via the touch sensitive display along a path, wherein the path overlaps one or more of the areas of the region of interest;
    identify the security devices of the plurality of security devices that service the one or more areas of the region of interest that the path overlaps;
    select one or more of the identified security devices;
    receive an input via the mobile device to change a configuration setting of one or more of the selected one or more of the identified security devices; and
    transmit the changed configuration setting to a remove device.

12. The non-transient computer readable medium of claim 11, wherein the mobile device comprises a smartphone or tablet.

13. The non-transient computer readable medium of claim 11, wherein when two or more security devices are selected, receiving an input to change the configuration setting for all of the selected security devices to a common configuration setting as a group.

14. The non-transient computer readable medium of claim 11, wherein when two or more security devices are selected, receiving an input to change the configuration setting for each of the selected security devices on an individual basis.

15. The non-transient computer readable medium of claim 11, wherein the overhead view of the region of interest shows the location of each of the plurality of security devices, and wherein the path does not need to overlap the location of a security device for that security device to be identified and selected.

16. The non-transient computer readable medium of claim 11, wherein the configuration setting comprises access rights for a particular individual.

17. The non-transient computer readable medium of claim 11, wherein the instructions that when executed cause the mobile device to further:
    display an indication on the overhead view of the region of interest that indicates which of the one or more of the identified security devices are selected.

18. The non-transient computer readable medium of claim 17, wherein the instructions that when executed cause the mobile device to further:

allow a user to de-select one or more of the selected security devices before changing the configuration setting of one or more of the selected one or more of the identified security devices.

19. A mobile device comprising:

a user interface including a touch sensitive display;

a memory for storing an overhead view of a region of interest of a building, wherein the region of interest is serviced by a plurality of security devices each servicing a corresponding area of the region of interest;

a transmitter;

a processor operatively coupled to the touch sensitive display, the memory and the transmitter, the processor configured to:

display the overhead view of the region of interest of the building on the touch sensitive display;

receive a drag motion from a user via the touch sensitive display along a path, wherein the path overlaps one or more of the displayed areas of the region of interest;

identify the security devices of the plurality of security devices that service the one or more areas of the region of interest that the path overlaps;

select one or more of the identified security devices;

receive an input via the user interface to change a configuration setting of one or more of the selected one or more of the identified security devices; and transmit the changed configuration setting to a remove device via the transmitter.

20. The mobile device of claim 19, wherein the processor is further configured to:

display an indication on the overhead view of the region of interest that indicates which of the one or more of the identified security devices are selected; and allow a user to de-select one or more of the selected security devices via the user interface before changing the configuration setting of one or more of the selected one or more of the identified security devices.

* * * * *